(12) United States Patent
Bourzeix

(10) Patent No.: US 6,349,196 B1
(45) Date of Patent: Feb. 19, 2002

(54) COMMUNICATIONS SYSTEM, MOBILE DEVICE AND METHOD

(75) Inventor: Francois Bourzeix, Toulouse (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/275,604

(22) Filed: Mar. 24, 1999

(30) Foreign Application Priority Data

Apr. 1, 1998 (EP) .............................................. 98400765

(51) Int. Cl.[7] .................................................. H03H 7/30
(52) U.S. Cl. .......................... 455/42; 455/75; 455/139; 375/220
(58) Field of Search .............................. 455/42, 43, 75, 455/77, 82, 141, 139; 375/220, 334, 319

(56) References Cited

U.S. PATENT DOCUMENTS

| | | | | |
|---|---|---|---|---|
| 5,200,977 A | * | 4/1993 | Ohnishi et al. ................ | 375/15 |
| 5,455,823 A | * | 10/1995 | Noreen et al. ................. | 370/50 |
| 5,579,346 A | * | 11/1996 | Kanzaki ....................... | 375/344 |
| 5,604,768 A | * | 2/1997 | Fulton ......................... | 375/220 |
| 5,678,215 A | | 10/1997 | Carsello ....................... | 455/265 |
| 5,838,735 A | * | 11/1998 | Khullar ........................ | 375/319 |
| 5,909,470 A | * | 6/1999 | Barratt et al. ................ | 375/324 |

FOREIGN PATENT DOCUMENTS

| | | | |
|---|---|---|---|
| DE | 4319769 | 7/1994 | ............ H04L/7/04 |
| GB | 2273405 | 6/1994 | ............ H03L/7/00 |
| WO | 9731425 | 8/1997 | ............ H03J/7/06 |

* cited by examiner

*Primary Examiner*—Thanh Cong Le
*Assistant Examiner*—Thuan T. Nguyen

(57) ABSTRACT

A mobile communications device is arranged to receive a modulated signal having a predetermined frequency. A frequency demodulator of the device demodulates the modulated signal, and a frequency correction arrangement calibrates the demodulation frequency of the device to the predetermined frequency by providing a preliminary difference estimation between the predetermined frequency and the demodulation frequency using a broadband portion of the modulated signal, followed by a main difference estimation (between the predetermined frequency and the demodulation frequency) using a dedicated narrowband portion of the modulated signal.

7 Claims, 2 Drawing Sheets

COMMUNICATIONS SYSTEM, MOBILE DEVICE AND METHOD

FIELD OF THE INVENTION

This invention relates to communications systems and particularly but not exclusively to cellular communications systems.

BACKGROUND OF THE INVENTION

In a cellular communications system such as a GSM (Global System for Mobile telecommunication) system, a mobile unit is arranged to communicate with a base station via a radio frequency. The base station is able to accurately achieve the correct frequency for transmission, by virtue of very accurate (and expensive) tuned crystals and circuits, including temperature compensating circuits.

A problem with this arrangement is that the mobile is typically equipped with a less accurate crystal and a simple tuning circuit, and the crystal must be tuned in order that the correct frequency can be received. A known solution to this problem is shown in FIG. 1, where a demodulator arrangement 5 of a mobile device has a frequency estimation scheme. An antenna 10 of the demodulator arrangement 5 receives a dedicated calibration signal, which is periodically transmitted in bursts by the base station.

A first Radio Frequency (RF) Voltage Controlled Oscillator (VCO) 20 and a second Intermediate Frequency (IF) VCO 30 demodulate the calibration signal in two stages, using oscillations from a quartz crystal 25. The VCOs 20 and 30 provide phase (IP) and quadrature (IQ) signals to a sigma-delta converter 40 which quantises the IP and IQ signals. The quantised signals are then passed through a Low-Pass Filter (LPF) 50 before being fed to software modules 60. The filtered, quantised IP and IQ signals represent a measured value. The dedicated calibration signal contains a known component which, when demodulated at the correct frequency by the VCO's 20 and 30, will produce a sinusoidal signal having a predetermined value. The software modules 60 compare the predetermined value with the measured value in order to derive an error value. This error value is fed to a Digital-to-Analogue Converter (DAC) 70 which converts the error value to a voltage which is used by a varicap circuit 80 to to fine-tune (or calibrate) the crystal 25 to the desired correct frequency. In this way the demodulator arrangement 5 of the mobile device is calibrated to the correct frequency.

However, a further problem occurs in that the dedicated signal must itself be received and demodulated correctly in order to provide the frequency estimation scheme, and this requires that the mobile device has a crystal with at least a certain accuracy, and thereby a certain minimum cost. This is because if the accuracy of the crystal is too poor, the pre-corrected frequency of the demodulator arrangement 5 will be so different to the predetermined frequency that the dedicated calibration signal will not be successfully received and demodulated.

This invention seeks to provide a communications system, mobile device and method which mitigate the above mentioned disadvantages.

SUMMARY OF THE INVENTION

According to a first aspect of the invention there is provided a communications system having an air interface, and comprising: a base station arranged for transmitting a modulated signal having a predetermined frequency over the air interface; and a mobile device arranged for receiving the modulated signal, the mobile device comprising: a frequency demodulator having a demodulation frequency, the frequency demodulator being arranged for demodulating the modulated signal; and, frequency correction means arranged for tuning the demodulation frequency to the predetermined frequency by providing a main difference estimation between the predetermined frequency and the demodulation frequency using a dedicated narrowband portion of the modulated signal, wherein the frequency correction means is further arranged to perform a preliminary difference estimation between the predetermined frequency and the demodulation frequency using a broadband portion of the modulated signal, before the main difference estimation.

According to a second aspect of the invention there is provided a mobile communications device arranged for receiving a modulated signal having a predetermined frequency from a base station over an air interface, the mobile device comprising: a frequency demodulator having a demodulation frequency, the frequency demodulator being arranged for demodulating the modulated signal; and, frequency correction means arranged for tuning the demodulation frequency to the predetermined frequency by providing a main difference estimation between the predetermined frequency and the demodulation frequency using a dedicated narrowband portion of the modulated signal, wherein the frequency correction means is further arranged to perform a preliminary difference estimation between the predetermined frequency and the demodulation frequency using a broadband portion of the modulated signal, before the main difference estimation.

According to a third aspect of the invention there is provided a method of providing frequency correction for a frequency demodulator having a demodulation frequency, the frequency demodulator being arranged to receive a modulated signal having a predetermined frequency, the method comprising the steps of: providing a preliminary difference estimation between the predetermined frequency and the demodulation frequency using a broadband portion of the modulated signal; tuning the demodulation frequency to the predetermined frequency using the preliminary difference estimation; providing a main difference estimation between the predetermined frequency and the demodulation frequency using a dedicated narrowband portion of the modulated signal, and, further tuning the demodulation frequency to the predetermined frequency using the main difference estimation.

In this way a mobile device is able to utilise an inexpensive crystal oscillator, with a more relaxed accuracy requirement than would otherwise be necessary. This is because the dedicated narrowband portion of the modulated signal is not used during the preliminary difference estimation.

BRIEF DESCRIPTION OF THE DRAWINGS

An exemplary embodiment of the invention will now be described with reference to the drawing in which.

DETAILED DESCRIPTION OF A PREFERRED EMBODIMENT

Figure 1:
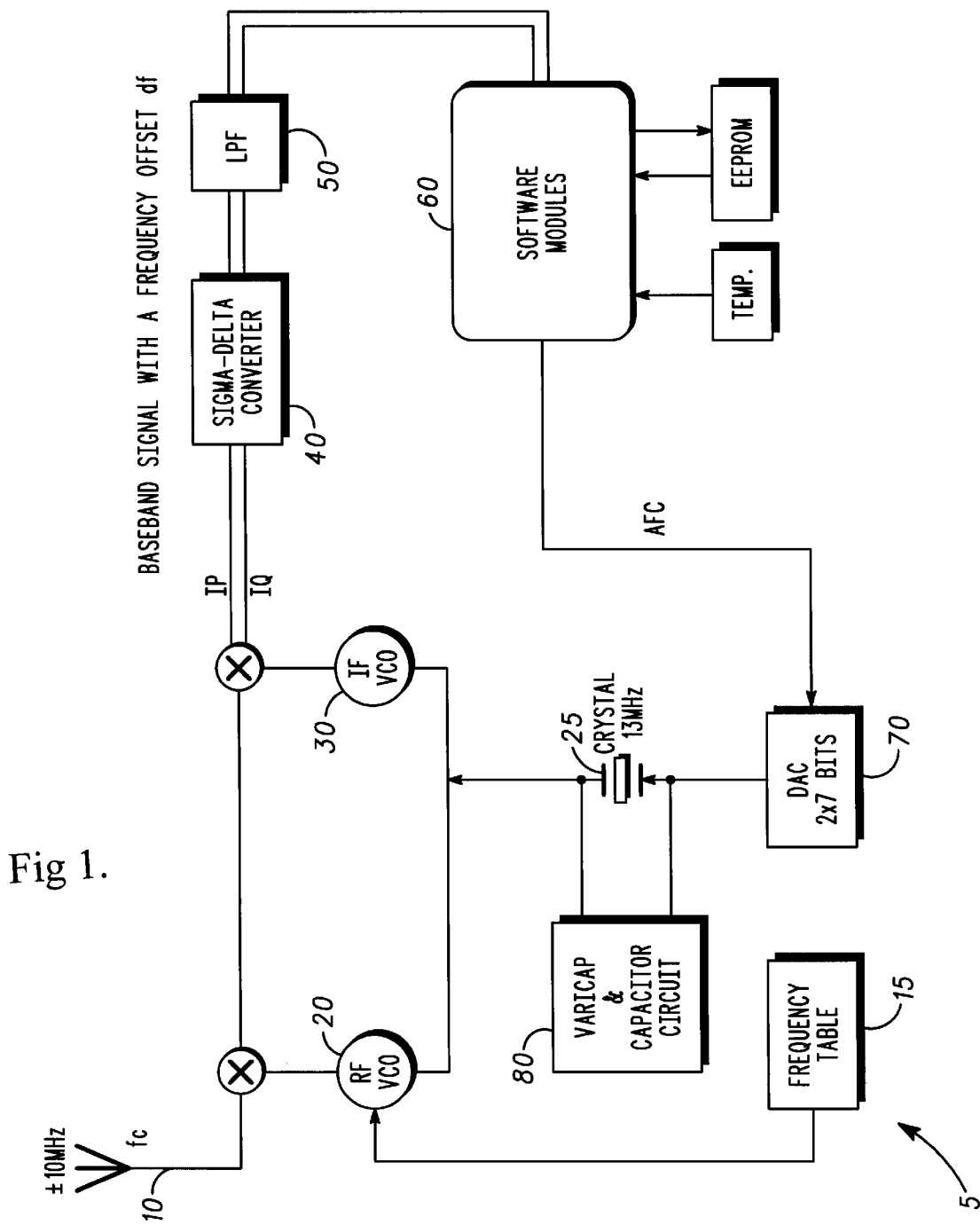
FIG. 1 shows a prior art demodulator arrangement incorporated in a mobile communications device.
Figure 2:
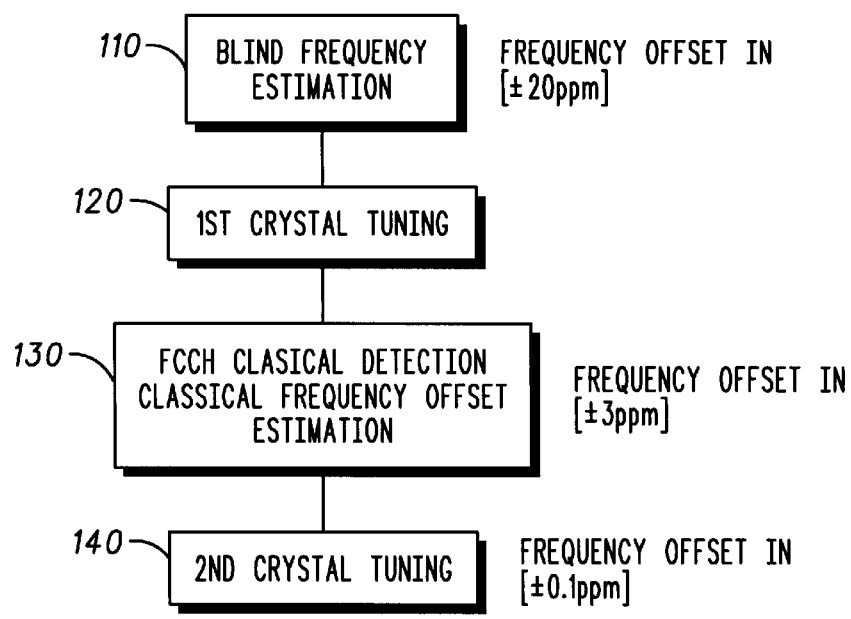
FIG. 2 shows a flow diagram of a preferred method of providing frequency correction in accordance with the invention; and, FIG. 3 shows a flow diagram of a portion of the frequency estimation method shown in FIG. 2.

Referring to FIG. 2, there is shown a method of providing frequency correction for a mobile communications device (as shown in FIG. 1) arranged to receive a modulated signal from a base station (not shown) over an air interface.

Referring now also to FIG. 1, the modulated signal has a predetermined frequency, which is typically one of a number of frequencies of the air interface. The mobile communications device has a demodulation arrangement 5 which is arranged to receive each of the number of frequencies.

The crystal 25 is a quartz crystal with a natural oscillation frequency in the order of the number of frequencies of the air interface. The crystal 25 must therefore be tuned by the varicap circuit 80 to the predetermined frequency (the selected one of the number of frequencies) in order that the RF VCO 20 receives substantially only the modulated signal from the antenna 10.

In order to do this, the prior art arrangement uses a frequency correction arrangement, whereby the crystal 25 is initially oscillated by the varicap circuit 80 without any correction. The base station (not shown) emits a calibration signal (known in GSM systems as a Frequency Correction CHannel, FCCH). The RF VCO 20 and the IF VCO 30 demodulate the calibration signal, to provide the IP and IQ signals to the sigma-delta converter 40. The quantised signals are then passed through the LPF 50 before being fed to the software modules 60. The software modules 60 compare the predetermined value with the measured value from the quantised signal in order to derive the error value, which is fed to the Digital-to-Analogue Converter (DAC) 70 which converts the error value to a voltage. The voltage is applied to the crystal 25 via the varicap circuit 80, and in this way the crystal 25 is tuned to the correct frequency.

In addition to the above frequency estimation, which is depicted at blocks 130 and 140 of FIG. 2, a further preliminary frequency estimation is provided at block 110, and this used to provide a first tuning step for the crystal 25 (block 120).

The preliminary frequency estimation is performed on a broadband portion of the modulated signal, before the main difference estimation using the FCCH burst.

The preliminary frequency estimation is a mean estimation of the phase distance between consecutive data samples, using known properties of the base station transmission (tail bits, guard bits, training sequence) to give an estimation of the crystal frequency offset.

Figure 3:
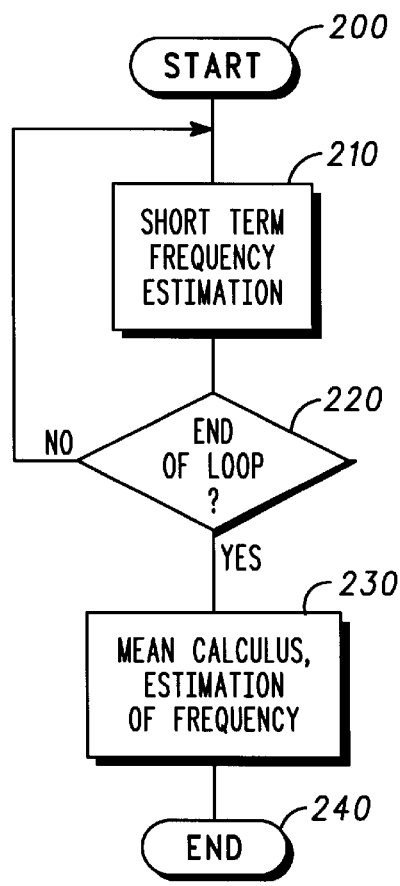

This is performed using an algorithm as depicted in FIG. 3. IP(k) and IQ(k) are the sampled In Phase and In Quadrature data that are received from the LPF 50. At a start block 200, the following expression is set:

$$z(k)=IP(k)+jIQ(k) \qquad \text{Equation 1}$$

Then a short term frequency estimation algorithm is performed (block 210) using the following expression:

$$\frac{1}{2\pi}\sum_{0<k<M}\mathrm{Arg}(z_k z^*_{k+1}) = f \qquad \text{Equation 2}$$

where M=157, which is a burst size in GSM. This is repeated for a number of bursts N. The block 220 considers whether an appropriate number of bursts N have estimated according to the calculaton of Equation 1 above. If not, the frequency estimation block 210 is revisited. When N bursts have been calculated, the results are:

$$f(1), f(2), \ldots, f(N) \qquad \text{Equation 3}$$

where f(x) is the frequency estimation for burst x.

Block 230 then performs a mean calculus frequency estimation step to find a mean value F of the N bursts as follows:

$$F=(f(1)+ \ldots +f(N))/N \qquad \text{Equation 4}$$

before the end of the algorithm is reached at the end block 240.

Using knowledge of the communications system and protocol, in this case information about the GSM multiframe and burst structure, the value of F may be subject to correction by data manipulation. Such correction may eliminate, for example, erroneous or misleading data values from the mean calculation, such as those which could have been estimated on a Frequency Burst (in the case where a beacon frequency of the air interface has been estimated during the algorithm). An example of this correction is given below.

For the sake of algebraic consistency with the above equations, the main routine of the algorithm is nominally chosen to estimate N+2 values, i.e. f(0), . . . ,f(N+1).

If the number N bursts are chosen such that there is no more than one frequency burst (for GSM this will be N=80), then among the N+2 given values, the 2 largest values (which may have been estimated on a frequency burst), should be eliminated from the mean calculation, so that they do not have an influence upon the result. These two values may be anywhere in the list of results, but for the sake of the following calculations, they will be taken to be f(N) and f(N+1), for ease of algebraic manipulation.

Known properties of the transmitted signal are then used to deduce the preliminary frequency estimation. The coarse frequency estimation values f verify:

$$f=a+df+n$$

where
- a is a value only depending on the deterministic part of the transmitted burst (for GSM: tail bits, guard bits, training sequence bits),
- df is the frequency offset to be estimated,
- n is nearly a zero mean Additive White Gaussian Noise which depends on the signal-to-noise ratio (SNR), on interference, and on the non-deterministic transmitted bits.

Using simulations it is possible to estimates bounds for a, such that $$\min(a)<=a<=\max(a)$$

and a maximum value □ max that is an upper bound of the possible variances of the noise n.

Equation 4 above is used to calculate F=(f(0)+ . . . +f(N−1))/N and the result verifies:

$$F=A+df+n' \qquad \text{Equation 5}$$

where A verifies the same inequalities than a, and where n' verifies:

$$\mathrm{Prob}(|n'|<=1.96\square\max/\sqrt(N)) \qquad \text{Equation 6}$$

A bounding of the frequency offset can be validly deduced with a probability p=0.95:

$$F-\max(a)-1.96\square\max/\sqrt(N)<=df<=F-\min(a)-1.96\square\max/\sqrt(N) \qquad \text{Equation 7}$$

The frequency estimation offset is chosen to be the middle of this interval. The precision or imprecision of this estimation consists of an irreducible term A (for which only superior and inferior bounds exist), and of a reducible term n', whose bound diminish if N increase as the square root of N. The estimation is then given by:

$$est(df)=F-(\max(a)+\min(a))/2 \qquad \text{Equation 8}$$

and the precision of the estimation is given by:

$$|df-est(df)|<=1.96\square \max/\sqrt{(N)}+(\max(a)-\min(a))/2 \qquad \text{Equation 9}$$

In this way an appropriate number for N is chosen, in order to achieve the desired precision for the blind frequency estimation.

The blind frequency estimation is hence based on a broadband portion of the received signal, in order to achieve a first demodulation frequency which is then used in the demodulation of the (narrowband) dedicated calibration signal.

It will be appreciated that alternative embodiments to the one described above are possible. For example, the precise configuration of the circuit of FIG. 1 may vary from that disclosed above.

Furthermore the algorithm used for the blind frequency estimation may differ from the precise calculations described.

What is claimed is:

1. A communications system having an air interface, and comprising:
   a base station arranged for transmitting a modulated signal having a predetermined frequency over the air interface; and
      a mobile device arranged for receiving the modulated signal, the mobile device comprising:
      a frequency demodulator having a demodulation frequency, the frequency demodulator being arranged for demodulating the modulated signal; and,
      frequency correction means arranged for tuning the demodulation frequency to the predetermined frequency by providing a main difference estimation between the predetermined frequency and the demodulation frequency using a dedicated narrowband portion of the modulated signal,
   wherein the frequency correction means is further arranged to perform a preliminary difference estimation between the predetermined frequency and the demodulation frequency using a broadband portion of the modulated signal, before the main difference estimation.

2. A mobile communications device, arranged for receiving a modulated signal having a predetermined frequency from a base station over an air interface, the mobile device comprising:
   a frequency demodulator having a demodulation frequency, the frequency demodulator being arranged for demodulating the modulated signal; and,
   frequency correction means arranged for tuning the demodulation frequency to the predetermined frequency by providing a main difference estimation between the predetermined frequency and the demodulation frequency using a dedicated narrowband portion of the modulated signal,
   wherein the frequency correction means is further arranged to perform a preliminary difference estimation between the predetermined frequency and the demodulation frequency using a broadband portion of the modulated signal, before the main difference estimation.

3. A method of providing frequency correction for a frequency demodulator having a demodulation frequency, the frequency demodulator being arranged to receive a modulated signal having a predetermined frequency, the method comprising the steps of:
   providing a preliminary difference estimation between the predetermined frequency and the demodulation frequency using a broadband portion of the modulated signal;
   tuning the demodulation frequency to the predetermined frequency using the preliminary difference estimation;
   providing a main difference estimation between the predetermined frequency and the demodulation frequency using a dedicated narrowband portion of the modulated signal, and,
   further tuning the demodulation frequency to the predetermined frequency using the main difference estimation.

4. The device of claim 2 wherein the frequency demodulator includes a crystal oscillator.

5. The method of claim 3 wherein the preliminary frequency estimation includes a calculation step based upon known attributes of the modulated signal.

6. The method of claim 5 wherein the known attributes of the modulated signal are attributes of signalling protocol.

7. The method of claim 5 wherein the modulated signal is a burst signal, and the known attributes of the modulated signal are burst attributes.

* * * * *